United States Patent [19]

Winter et al.

[11] Patent Number: 5,298,295
[45] Date of Patent: Mar. 29, 1994

[54] CHEMICAL VAPOR DEPOSITION OF METAL CHALCOGENIDE FILMS

[75] Inventors: Charles H. Winter, Grosse Point Park; T. Suren Lewkebandara, Detroit, both of Mich.

[73] Assignee: Wayne State University, Detroit, Mich.

[21] Appl. No.: 865,324

[22] Filed: Apr. 8, 1992

Related U.S. Application Data

[63] Continuation-in-part of Ser. No. 683,273, Apr. 10, 1991, Pat. No. 5,112,650.

[51] Int. Cl.$^5$ ............................................. C23C 16/00
[52] U.S. Cl. .................... 427/585; 427/248.1; 427/255; 427/294; 427/295; 427/314; 427/318
[58] Field of Search .............. 427/255.2, 585, 248, 427/255, 294, 295, 314, 318, 272.2

[56] References Cited

FOREIGN PATENT DOCUMENTS 103470 9/1983 European Pat. Off. .

OTHER PUBLICATIONS

D. Zehnder et al., Transport Properties of Thin Film TiS$_2$ Produced by ARE, Solid State Ionics 18 & 19, 1986, pp. 813–817.
Reaktionen von Titantetrachlorid mit Bistrimethylsilylsulfid. Die Kristallstrukturen von (NEt$_4$)$_2$..., V. Krug et al., Z. Naturforsch. 43b, 1988, pp. 1501–1509.
A. Bensalem et al., Novel Low Temperature Synthesis of Titanium Sulfide, Mat. Res. Bull., vol. 23, 1988, pp. 857–868.
P. Ehrlich et al., Darstellung und Eigenschaften von TiSCl$_2$, Zeit. Anorg. Alig. Chem., 1959, vol. 301, pp. 289–290.
L. Bosnea et al., Mechanism of the Reaction Between Titanium Tetrachloride and Thiophenols, An. Stiint Univ., "Al. I. Cuza", Iasi, Sect. 1C, 1974, vol. 20, pp. 75–82.
K. Kanehori et al., Titanium Disulfide Films Fabricated By Plasma CVD, Solid State Ionics 18 & 19, 1986, pp. 818–822.
K. Kamehori et al., Kinetic Study on Chemical Vapor Deposition of Titanium Disulfide Thin Film, J. Electrochem. Soc. vol. 136, No. 5, May 1989, pp. 1265–1270.
S. Kikkawa et al., Titanium Disulfide Thin Film Prepared By Plasma CVD, J. Mater, Res., vol. 5, No. 12, Dec. 1990, pp. 2894–2901.

*Primary Examiner*—Bernard Pianalto
*Attorney, Agent, or Firm*—Brooks & Kushman

[57] ABSTRACT

A process for depositing a film of metal chalcogenide is disclosed. The process comprises providing a single source of a metal chalcogenide and heating said source to a temperature sufficient to sublime the single source under a pressure ranging from 0.0001 to 760 torr so that the sublimate is delivered into a reaction zone. Within this reaction zone, a substrate is deposed upon which deposition may occur. The reaction zone is heated to approximately 200° to 800° C. The sublimate is passed through this reaction zone and over the substrate to produce a thin film of metal chalcogenide which is deposited upon the substrate.

21 Claims, 1 Drawing Sheet

CHEMICAL VAPOR DEPOSITION OF METAL CHALCOGENIDE FILMS

CROSS REFERENCE TO RELATED APPLICATION

The present application is a continuation-in-part of copending U.S. patent application Ser. No. 683,273, filed Apr. 10, 1991, now U.S. Pat. No. 5,112,650, issued May 12, 1992.

TECHNICAL FIELD

The present invention relates to the deposition of metal chalcogenide films onto a substrate through the use of chemical vapor deposition techniques utilizing a single precursor source.

BACKGROUND ART

In recent years, thin films of certain species of metal chalcogenides, such as titanium disulfide ($TiS_2$) and other transition metal sulfide materials have been studied. Films of $TiS_2$ may be formed using chemical vapor deposition (CVD) methods, by sulfurization of titanium metals at elevated temperatures, and sputtering methods.

A number of CVD processes have been described by the prior art. Deficiencies in such methods were discussed in the parent case which is herein incorporated by reference. Typically in these prior art processes, gaseous streams of the two reactants (i.e. titanium tetrachloride and hydrogen sulfide) are mixed in a heated reactor to deposit the desired metal chalcogenide as a film on a substrate suspended in the reactor. It is often necessary in these processes to use a large excess of the chalcogenide source (i.e. $H_2S$) in order to achieve reasonable deposition rates. Moreover, the chemical yield of the films in such cases is often extremely low. This results in the waste of most of the agents required to form the film, which in turn, leads to an inefficient process with concomitant toxic waste problems.

It would be highly desirable to have a volatile single source precursor capable of being sublimed into the CVD reactor to deposit the film. Ideally such precursors would contain the correct stoichiometry of elements needed for the metal chalcogenide film and would minimize waste materials. Unfortunately, however, the prior art has been unable to provide such a material and no single source precursor to CVD titanium disulfide films has been reported in the literature.

The most important commercial application for titanium disulfide films is as cathodes in lithium batteries. In such an application it is highly desirable that the thin film of $TiS_2$ have a crystallographic orientation such that the c-axis is parallel to the plane of the substrate. In such an orientation, pores in the crystals are perpendicular to the plane of the substrate and are optimum for the intercalation of lithium, which constitutes the primary discharge reaction in the lithium battery. Conversely, an orientation in which the pores of the crystals are parallel to the plane of the substrate leads to an inefficient cathode reaction, due to poor intercalation of lithium ions into the $TiS_2$.

It has been demonstrated by Kikkawa et al. (*J. Mater. Res.* 1990, 5, 2894) and Kanehori et al. (*J. Electrochem. Soc.* 1989, 136, 1265) that $TiS_2$ films with predominant (110) crystallographic orientation provide optimum cathode performance in a lithium battery. However, such preferred films with the highly desirable (110) orientation have only been prepared from CVD techniques using two separate gaseous streams of titanium tetrachloride and hydrogen sulfide and thus incorporate all of the prior art limitations, including the undesirable deposition characteristics discussed above.

SUMMARY OF THE INVENTION

The problems and limitations of the prior art have been overcome with the invention disclosed herein. The invention comprises a process for depositing a film of a metal chalcogenide comprising the steps of providing a single source of a metal chalcogenide; heating the single source to a temperature sufficient to sublime the single source at a pressure ranging from 0.0001 to 760 torr so that the sublimate is delivered into a reaction zone; affording a substrate within the reaction zone to define a surface upon which deposition may occur; heating the reaction zone to approximately 200° to 800° C.; and passing the sublimate over the substrate to produce a film of metal chalcogenide which is deposited on the substrate. The invention further comprises a method for preparing films of the desired crystallographic orientation using the single source CVD precursors as disclosed herein.

It is an object of the invention to provide volatile single source precursors, which contain the required stoichiometric ratio of elements, for the deposition of metal chalcogenide films.

It is also an object of the invention to provide a CVD process for metal chalcogenide films which produces a reduced amount of effluent waste.

A further object of the invention is to provide a process that produces films at pressures lower than ambient atmospheric pressure.

Finally, it is an object of the invention to provide metal chalcogenide films which possess a predominant (110) crystallographic orientation through the use of a volatile single source precursor, thereby maximizing the films' utility as cathodes for lithium battery applications.

In satisfying the above-mentioned objects, an organothiol ($ER_3SH$) is reacted with a titanium tetrahalide in an organic solvent to provide compounds of the formulation $[TiX_4(HSER_3)_2]$. This material is sublimed and is delivered in the gaseous phase to a heated substrate which is supported within a reaction zone. Upon heating to a temperature of 200° to 800° C. the substrate is coated with a $TiS_2$ film. Any material not deposited as a film on the desired substrate passes through as exhaust which is subsequently entrapped to minimize adverse environmental consequences.

Films prepared with the single source precursors of the invention and which are less than two microns thick, prepared at temperatures above 400° C., exhibit nearly exclusive (001) crystallographic orientations. However, such films which are ten microns or more thick and grown at temperatures above 400° C. exhibit a predominantly (110) crystallographic orientation.

BRIEF DESCRIPTION OF THE DRAWINGS

The Figure illustrates a side view of a preferred embodiment of the CVD reactor used herein.

BEST MODE FOR CARRYING OUT THE INVENTION

Figure 1:
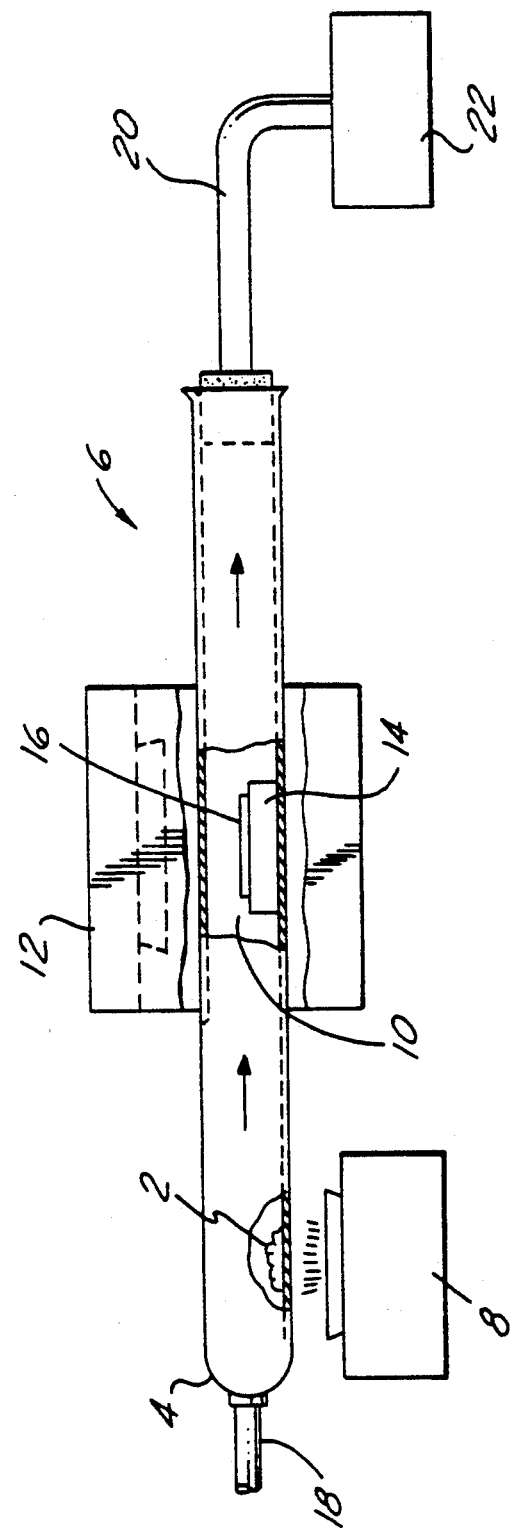

To prepare the single source precursors of the invention, titanium tetrahalides ($TiX_4$) are reacted with an organothiol (ER$_3$SH) in an organic solvent to provide an initial product of the formula TiX$_4$(HSER$_3$)$_2$.

X may be a halogen, i.e. any member of the group consisting of fluorine, chlorine, bromine, and iodine. It is most preferred that X be comprised of chlorine. Accordingly, it is most preferred that titanium tetrachloride (TiCl$_4$) be reacted with an organothiol (HSER$_3$) in an organic solvent.

Suitable organic solvents can include alkane solvents such as hexane, aromatic solvents such as benzene and toluene, and halogenated solvents such as dichloromethane. It is most preferable that hexane be used.

E may be any member of the group consisting of carbon, silicon, germanium, or tin. It is preferred that E be carbon. R may be selected from the group consisting of hydrogen, an alkyl group, an aryl group and mixtures thereof. Most preferably, E and R$_3$ form a single organic species. Most preferably, E will be carbon and R$_3$ will be comprised of a hydrogen and a cyclic pentamethylene chain, the combination thereof comprising a cyclohexyl group.

Accordingly, it is most preferred that the single source precursors be prepared by reacting titanium tetrachloride with cyclohexylthiol in hexane. However, it will be further appreciated that R may also be selected from the alkyl group consisting of a methyl group, a primary alkyl group, a secondary alkyl group, a tertiary alkyl group, and mixtures thereof.

Although not wishing to be bound by any particular theory, it is believed that the choice of R determines the stability of the complex TiX$_4$(HSER$_3$)$_2$.

In particular, when ER$_3$ is a tert-butyl group, the initial product will decompose at temperatures up to and above 25° C. to produce a reddish-brown polymeric material. It is believed that TiCl$_4$($^t$BuSH)$_2$ decomposes to produce (TiCl$_2$S)$_n$. This material has been used in the instant invention to produce TiS$_2$ films. However, it is believed that this material in and of itself is not a single source precursor. Rather, the ability of (TiCl$_2$S)$_n$ to produce TiS$_2$ films relies solely on the presence of residual nondecomposed TiCl$_4$($^t$BuSH)$_2$.

Most preferably, 100 milligrams of the single source precursor will be utilized to provide a 1 to 2 micron thick film on a substrate 2 centimeters × 5 centimeters in size.

Turning to the Figure, the single source precursor 2 will be deposited in the closed end 4 of sealed quartz tube 6. Glass tubes have insufficient strength at the higher temperatures used herein.

Using heat source 8, single source precursor 2 is sublimed. Heat source 8 may provide temperatures from 25° to 300° C. at pressures ranging from 0.0001 to 760 torr. Most preferably, heat source 8 will supply a temperature of between 25° to 75° C. at a pressure of between 0.0001 to 0.1 torr. This typically provides a deposition rate of 0.1 microns per minute.

The sublimate of single source precursor 2 is delivered to a reaction zone 10. The reaction zone 10 is comprised of that section of the quartz tube 6 arrayed within a furnace 12.

Furnace 12 heats reaction zone 10 to temperatures of between 150° to 1000° C. Most preferably, the reaction zone will be heated to a temperature between 400° and 600° C. Disposed within reaction zone 10 of quartz tube 6 is a ceramic stage 14 upon which the desired substrate 16 has been placed.

Substrate 16 may be comprised of glass, steel or individual sheets of monocrystalline silicon. Low sodium glass is particularly suitable. Typical substrates are normally in the range of 2 centimeters by 5 centimeters, although larger pieces are possible.

Although not necessary, spraying of the substrate with freon is permissible in order to remove any surface particles such as dust and the like. Corning 7059 is a suitable glass. Suitable silicon may be obtained from Mattheson Scientific of Detroit, Mich.

Upon the passing over of sublimed precursor 2, substrate 16 is coated with a thin film of metal chalcogenide.

If desired, a stream of inert gas such as nitrogen may be introduced at port 18 to assist in the flow of sublimed precursor 2 through the quartz tube 6.

After exiting reaction zone 10, sublimed precursor 2 exits quartz tube 6 via tubing 20 to exit the system through vacuum pump 22.

The following examples are provided to illustrate the invention but are not intended to limit the invention. It is anticipated that those skilled in the art will understand that other reactor configurations are possible. All degrees are in centigrade and all parts are by weight percent unless otherwise indicated.

EXAMPLE 1

A reaction vessel containing titanium tetrachloride (1 mmol) dissolved in hexane (20 mL), was cooled to 0° C. in an ice/water bath. Tertbutylthiol (2 mmol) was added to this solution and was allowed to stir for 0.25 hours. During this time, a yellow crystalline solid of the formula TiCl$_4$($^t$BuSH)$_2$ precipitated from the medium (80–90% yield). Spectroscopic analysis revealed: $^1$H NMR (CDCl$_3$, δ) 1.95 (s, 2SH), 1.42 (s, 2 C$_4$H$_9$); $^{13}$C NMR (CDCl$_3$, ppm) 42.08 (s, C(CH$_3$)$_3$), 34.72 (s, C(CH$_3$)$_3$).

EXAMPLE 2

Complex TiCl$_4$($^t$BuSH)$_2$ (1 mmol) was allowed to stand at 25° C. for 1 hr, either in the solid state or dissolved in dichloromethane (20 mL), during which time it decomposed to an insoluble red-brown polymeric product of the formula (TiCl$_2$S)$_n$ (54% yield). Microanalytical data revealed that: analysis calculated for TiCl$_2$S predicted Cl=47.00 Intact, Cl=46.43 was found.

EXAMPLE 3

A reaction vessel containing titanium tetrachloride (1 mmol) dissolved in hexane (20 mL), was cooled to 0° C. in an ice/water bath. Cyclohexylthiol (2 mmol) was then added to this solution and stirred for 0.25 hours. During this time, a yellow crystalline solid of the formula TiCl$_4$(C$_6$H$_{11}$SH)$_2$ precipitated from the medium (84% yield). This compound was thermally stable at 25° C.

Spectroscopic and analytical data revealed: mp 75°–76° C. (sublimes with some decomposition); IR (nujol, cm$^{-1}$) $v_{SH}$ 2492 (m); $^1$H NMR (C$_6$D$_6$, δ) 2.51 (m, C$_6$H$_{11}$SH), 1.72–0.82 (m, C$_6$H$_{11}$SH); $^{13}$C{$^1$H} (C$_6$D$_6$, ppm) 39.55 (s, CHSH), 37.07 (s, 2 CH$_2$), 25.89 (s, 2 CH$_2$), 25.01 (s, CH$_2$). Analysis calculated for C$_{12}$H$_{24}$Cl$_4$S$_2$Ti: C, 34.14; H, 5.73. Found: C, 33.82; H, 5.68.

EXAMPLE 4

Complex TiCl$_4$(C$_6$H$_{11}$SH)$_2$ (2 mmol) was placed in a glass vessel, which was then connected to a quartz tube. A glass substrate, supported on a ceramic stage, was placed in the quartz tube. Approximately half of the quartz tube was held in a furnace set at 500° C. The glass vessel, which was held outside the heated section of the quartz tube, was heated to a temperature between 50° and 100° C. at ambient atmospheric pressure. This resulted in sublimation of the single source precursor into the heated section of the quartz tube which held the heated substrate. Passage of the gaseous precursor through the heated zone resulted in the substrate being coated with a film of $TiS_2$. The deposition rate was about 1 micron per minute. The film obtained was of high-quality and was bronze colored. X-ray diffraction of a 2 micron thick film indicated an exclusive (001) crystallographic orientation.

EXAMPLE 5

Crystalline $TiS_2$ film was also deposited using the experimental method described in Example 4, except that the reactor was held at a pressure of 0.1 torr. This resulted in a film of similar quality and identical crystallographic orientation obtained in Example 4, except that the deposition rate was about 0.05 microns per minute.

EXAMPLE 6

$TiS_2$ films of about 2 microns thickness were prepared on glass substrates using the material from Example 3 at 500° C. and 0.1 torr. X-ray diffraction analysis revealed nearly exclusive (001) crystallographic orientations in all of these films.

EXAMPLE 7

$TiS_2$ films of about 10 microns thickness were prepared on glass substrates using the material from Example 3 at 500° C. and 0.1 torr. X-ray diffraction analysis revealed predominant (101) and (110) crystallographic orientations. These orientations are suitable for use in lithium batteries.

As is apparent from the foregoing descriptions, the process for depositing thin films of metal chalcogenide utilizing single source precursors according to the present invention has various advantages, including:

(1) High-quality films of titanium disulfide are produced at moderate temperatures from the single source precursor $TiX_4(HSER_3)_2$.

(2) Films produced using the single source precursors are of high quality and are of similar quality to the films prepared using the atmospheric pressure CVD reaction of titanium tetrachloride and organothiols.

(3) Film deposition rates using the single source precursors range from 0.01 to 2.0 microns per minute, which is faster than prior art processes.

(4) The use of the single source precursors reduces toxic and odiferous reactor effluent.

(5) The single source precursors provide highly crystallographically oriented films.

(6) Atmospheric pressure and low pressure CVD reactions using single source precursors of the formula $TiX_4(HSER_3)_2$ produce metal chalcogenide films with the correct crystallographic orientation for use as cathode materials in lithium batteries.

While the best modes for carrying out the invention have been described in detail, those familiar with the art to which the invention relates will recognize various alternative designs and embodiments for practicing the invention as defined by the following claims.

We claim:

1. A process for depositing a film of a metal chalcogenide comprising the steps of:
providing a single source of the metal chalcogenide;
heating the single source to a temperature sufficient to sublime the single source at a pressure ranging from 0.0001 to 760 torr so that a sublimate is delivered into a reaction zone;
affording a substrate within the reaction zone to define a surface upon which deposition may occur;
heating the reaction zone to about 200°-800° C.; and
passing the sublimate over the substrate to produce a film of the metal chalcogenide which is deposited on the substrate.

2. The process of claim 1 wherein the single source comprises material having the formula $TiX_4(HSER_3)_2$ wherein X is selected from the group consisting of fluorine, chlorine, bromine and iodine; E is selected from the group consisting of carbon, silicon, germanium and tin; and wherein R is selected from the group consisting of hydrogen, an alkyl group, an aryl group and mixtures thereof 3. The process of claim 2 wherein the alkyl group is selected from the group consisting of a methyl group, a primary alkyl group, a secondary alkyl group, a tertiary alkyl group, and mixtures thereof.

4. The process of claim 3 wherein E is carbon and $R_3$ is hydrogen and a cyclical primary alkyl group.

5. The process of claim 4 wherein the cyclical primary alkyl group is a five-membered methylene chain.

6. The process of claim 2 wherein X is chlorine.

7. The process of claim 1 wherein the step of passing the sublimate over the substrate occurs under pressures from 0.0001 to 0.1 torr.

8. The process of claim 1 wherein the substrate comprises a low sodium glass plate.

9. The process of claim 1 wherein the substrate comprises stainless steel.

10. A process for preparing a film of a metal chalcogenide comprising the steps of:
providing a single source of a metal chalcogenide;
heating the single source to a temperature sufficient to sublime the single source at a pressure equal to 0.1 torr;
affording a substrate within the reaction zone to define a surface upon which deposition may occur;
heating the reaction zone to temperatures equal to or greater than 400° C.; and
passing an effective amount of the sublimate over the substrate for a period of time sufficient to produce a film of the metal chalcogenide greater than 10 microns thick which is deposited on the substrate, wherein a portion of the film between 0 to 5 microns thick has a predominant (001) crystallographic orientation;
a portion of the film 5 to 10 microns thick having a mixture of (001), (101), and (110) crystallographic orientations; and
a portion of the film greater than 10 microns thick having a predominant (110) crystallographic orientation.

11. The process of claim 10, wherein the metal chalcogenide is formed at a deposition of about 0.01-2.0 microns per minute.

12. A process for depositing a film of a metal chalcogenide comprising the steps of:
providing a single source of the metal chalcogenide;
heating the single source to a temperature sufficient to sublime the single source at a pressure ranging from 0.0001 to 760 torr so that a sublimate is delivered into a reaction zone;

affording a substrate within the reaction zone to define a surface upon which deposition may occur;

heating the reaction zone to about 200°–800° C.; and passing an effective amount of the sublimate over the substrate for a period of time sufficient to produce a film of the metal chalcogenide greater than 10 microns thick which is deposited on the substrate.

13. The process of claim 12 wherein the single source comprises material having the formula $TiX_4(HSER_3)_2$, wherein X is selected from the group consisting of fluorine, chlorine, bromine, and iodine; E is selected form the group consisting of carbon, silicon, germanium, and tin; and wherein R is selected from the group consisting of hydrogen, an alkyl group, an aryl group and mixtures thereof.

14. The process of claim 13 wherein the alkyl group is selected from the group consisting of a methyl group, a primary alkyl group, a secondary alkyl group, a tertiary alkyl group, and mixtures thereof.

15. The process of claim 14 wherein E is carbon and $R_3$ is hydrogen and a cyclical primary alkyl group.

16. The process of claim 15 wherein the cyclical primary alkyl group is a five-membered methylene chain.

17. The process of claim 13 wherein X is chlorine.

18. The process of claim 12 wherein the step of passing the sublimed material over the substrate occurs under pressures from 0.0001 to 0.1 torr.

19. The process of claim 12 wherein the substrate comprises a low sodium glass plate.

20. The process of claim 12 wherein the substrate comprises stainless steel.

21. The process of claim 12 further comprising:
heating the single source at a pressure equal to 0.1 torr and;
heating the reaction zone to temperatures equal to or greater than 400° C.

* * * * *